United States Patent [19]

Comeau et al.

[11] Patent Number: 4,558,276
[45] Date of Patent: Dec. 10, 1985

[54] DEVICE AND METHOD FOR SENSING ELECTRIC CURRENT IN A CONDUCTOR

[75] Inventors: Leon J. Comeau, 1603 S. 17th St., Grand Forks, N. Dak. 58201; Roger O. Birkholz, East Grand Forks, Minn.

[73] Assignee: Leon J. Comeau, Grand Forks, N. Dak.

[21] Appl. No.: 494,407

[22] Filed: May 13, 1983

[51] Int. Cl.$^4$ .............................. G01R 1/00; H01F 3/04
[52] U.S. Cl. .............................. 324/117 H; 324/127; 336/176
[58] Field of Search ............... 324/117 H, 117 R, 127, 324/251, 252, 133; 338/32 H; 323/368; 307/309; 336/176

[56] References Cited

U.S. PATENT DOCUMENTS

| 4,023,043 | 5/1977 | Stevenson . |
| 4,034,233 | 7/1977 | Leyde . |
| 4,059,747 | 11/1977 | Brody . |
| 4,060,709 | 11/1977 | Hanson . |
| 4,125,782 | 11/1978 | Pollnow, Jr. . |
| 4,146,923 | 3/1979 | Borkan . |
| 4,228,511 | 10/1980 | Simcoe et al. . |
| 4,245,319 | 1/1981 | Hedges . |
| 4,264,960 | 4/1981 | Gurr . |
| 4,321,477 | 3/1982 | Bartlett . |
| 4,324,987 | 4/1982 | Sullivan, II et al. . |
| 4,414,543 | 11/1983 | Schweitzer ................. 324/133 X |

FOREIGN PATENT DOCUMENTS

| 1105514 | 4/1961 | Fed. Rep. of Germany ...... 324/251 |
| 301631 | 4/1971 | U.S.S.R. ............................. 324/127 |

OTHER PUBLICATIONS

*Hall Effect Transducers—How to Apply Them as Sensors*, pp. 131-133, 165-168, 265-266, published by Micro Switch Division of Honeywell (1982, U.S.A.).

Primary Examiner—Stewart J. Levy
Assistant Examiner—Stephen M. Baker
Attorney, Agent, or Firm—Dorsey & Whitney

[57] ABSTRACT

A device and method for sensing current flowing in an electrical conductor. An open loop of flexible magnetically conductive material is positioned to substantially encircle a current carrying conductor. Two ends of the loop overlap to form a flux gap between them. Magnetic flux of the magnetic field associated with the current is concentrated in the flux gap. A Hall Effect transducer mounted in the flux gap senses the magnetic field and hence the current flowing in the conductor.

14 Claims, 2 Drawing Figures

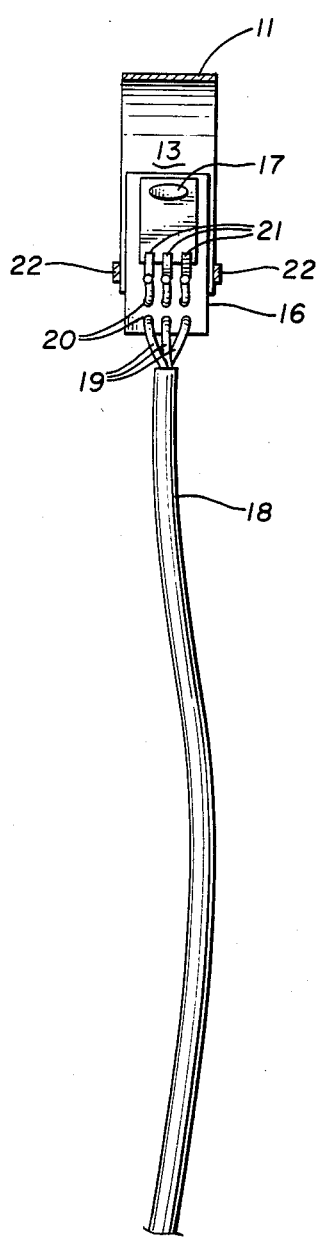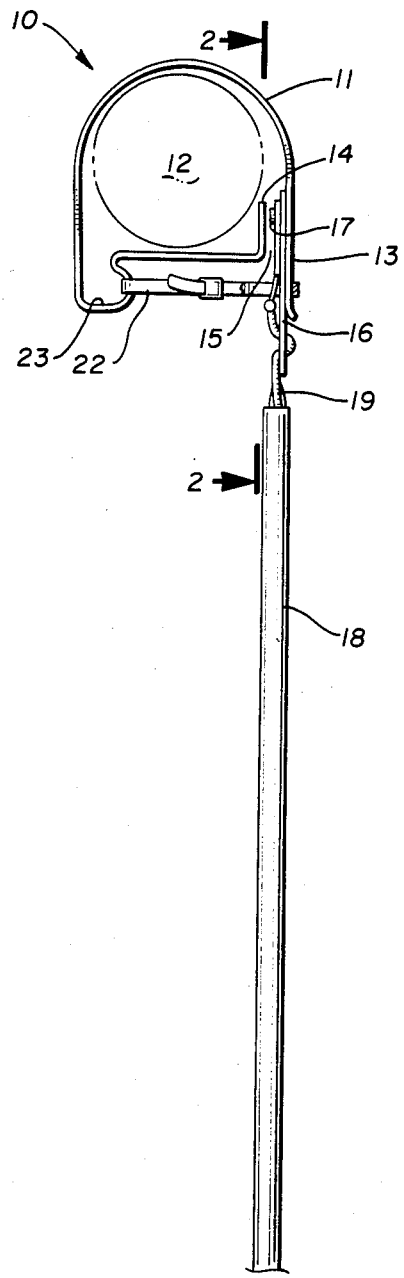

DEVICE AND METHOD FOR SENSING ELECTRIC CURRENT IN A CONDUCTOR

BACKGROUND OF THE INVENTION

1. Field of the Invention

This invention relates generally to the field of electric current sensing devices. More particularly, this invention relates to a device and method for sensing electric current flowing in a conductor by concentrating magnetic flux of the magnetic field associated with the current and detecting that flux with a Hall Effect transducer.

2. Description of the Prior Art

There are several reasons why it is desirable to be able to sense and measure the electric current flowing in a service conductor for industrial plants, businesses or homes. One reason is to permit monitoring the load in the electrical system that is served by the conductor. A second is to both monitor and regulate power consumption so as to take advantage of reduced power rates charged by utility companies during certain time intervals, and to limit usage during high rate times. Regulation of consumption in an electrical system is especially advantageous when the user rate set by the utility companies increases sharply once a certain level of power consumption is reached. If the load in an electrical system can be reduced or partially shed when the critical level of power consumption is reached, the user can economically optimize its power use. The corresponding advantage to utility companies is that peak power loads can be reduced.

There exist load management systems in the prior art that are activated by devices that indicate the instantaneous level of power consumption by the electrical system.

One known load sensing device is a pulse counter for counting pulses from a wattmeter installed by a utility company, which often generates pulses at a rate proportional to power consumption. However, not all wattmeters are of the type which generate such pulses and such counters therefore have limited application.

A second known device is a current transformer, which is used to tap a small, predetermined fraction of a large current to be measured, permitting measurement by a small ammeter or wattmeter. In one prior art arrangement, current transformers are used together with Hall Effect transducers. (See U.S. Pat. No. 4,034,233) (These transducers can be used to sense the alternating magnetic field that is associated with an alternating electric current flowing in a conductor. Because that magnetic field has a strength and polarity that is determined by and proportional to the current, a Hall Effect transducer is, in effect, sensing the strength of the current tapped by the current transformer.) Thus, in the known device, the Hall Effect transducer voltage output is proportional to a sensed magnetic field strength, which is proportionally related to the current in the current transformer, which, in turn, is proportional to the current in the line to which the transformer is coupled. By knowing the characteristics of the current transformer and the transducer and by application of the well known relationship between voltage and current, the power level may be determined.

A primary disadvantage of a current/power sensing device using a current transformer is its size. In homes and smaller commercial buildings the electrical panels are not large and there may not be a great deal of available space between the point at which the power feeder lines enter the panel and the bus where they are connected. Accordingly, when it is desired to insert a current sensing device at the electrical panel, use of a current transformer may be very difficult or impossible unless a larger panel is installed or a junction box is placed in the conduit system upstream from the electrical panel. In either case, a technician may be required and several hours labor may be necessary. In addition, unless a split current transformer is used (which is usually larger and more expensive) the power feeder lines may have to be disconnected to install the current transformer.

In some applications, a Hall Effect device simply placed in proximity to a current-carrying conductor can be used. The disadvantages of such an arrangement are its limited sensitivity and possible inaccuracy when magnetic conductors approach the current conductor and influence the strength of the field to be measured. It is also known that sensitivity of a Hall Effect current sensing device can be improved by use of a toroidal core. "Hall Effect Transducers", a 1982 publication of the Micro Switch division of Honeywell shows use of a toroidal core having an air gap in which a Hall Effect device is inserted. The conductor in which current is to be sensed passes through the center of the toroid or is wrapped around the toroid for one or more turns.

SUMMARY OF THE INVENTION

The present invention provides a device to sense and a method of sensing electric current flowing in a conductor. The invention fills a need for a method and device for sensing current that is easily and quickly installed and may be installed in the limited space available in smaller industrial or commercial electrical systems or in the average home.

In its apparatus aspect, the invention comprises an open loop of flexible, magnetically conductive material positioned to substantially encircle a conductor of electric current. The two ends of the loop overlap. The ends are substantially parallel in the area of overlap, forming a flux gap between them. A Hall Effect transducer is mounted in the flux gap. Loop adjustment means may be used to tighten the loop around the conductor and narrow the flux gap. Operating power is delivered to the transducer, and the output from the transducer is communicated to a downstream device that makes use of the current level information represented by the output (e.g., for measurement, control or display) but that does not form part of this invention.

In its method aspect, the invention comprises substantially encircling a conductor of electric current by an open loop of flexible, magnetically conductive material; positioning one end of the loop substantially parallel to and overlapping the other end, while leaving a flux gap between the ends; mounting a (linear) Hall Effect transducer in the flux gap between the ends; providing power for the transducer: and communicating the output of the transducer to a downstream device responsive to the sensed current level.

As will be seen, the invention provides an elegantly simple and inexpensive method and apparatus to sense the strength of an electric current flowing in a conductor. The device of the invention would typically be installed on the power feeder or main service conductor of an electrical system. The current level sensed by the device can be used to monitor or control the load on the electrical system. When the sensed current exceeds a predetermined level, loads can be shed from the system. When the sensed current drops to a predetermined level, loads can be added again to the system. (See, e.g., U.S. Pat. No. 4,324,987 which shows such a system) This facility allows for economic use of electrical power. Using current level information sensed by the invention, a load control system can be programmed to remove less essential loads during times of high electric power user rates and restore loads during times of lower user rates.

The method and device of the present invention concentrates the magnetic flux of the magnetic field associated with an electric current flowing in a conductor. The flux is concentrated and conducted to the flux gap between the two ends of the loop, so enabling the (linear) Hall Effect transducer to detect relatively weak magnetic fields, such as occur with ordinary household currents. The invention thus has a broad field of use ranging from industrial or commercial use to the average home.

Accordingly, it is an objective of the invention to provide a simple and inexpensive device and method for sensing an electric current in a conductor, which has a broad range of use, including use in the average home.

It is an objective of the invention to provide a compact current sensing device made from an open loop of magnetically conductive material positionable to substantially encircle a conductor of electric current.

It is an objective of the invention to provide a flexible loop of magnetically conductive material which can be easily positioned around a conductor to sense current through the conductor.

It is a further objective of the invention to provide a current sensing device which produces a voltage output linearly proportional to the current sensed.

It is a still further objective of the invention to provide a current sensing means suitable for use in a system for controlling shedding and restoring of electrical loads in a home or commercial establishment.

These and other objectives of the invention may be more clearly understood by reference to the following description in conjunction with the appended drawings.

BRIEF DESCRIPTION OF THE INVENTION

FIG. 1 shows a plan view of the preferred embodiment of the invention in position around a circular electrical conductor (shown in cross-section).

FIG. 2, taken along the line 2—2 of FIG. 1, shows the Hall Effect transducer and its mounting board, which form a part of the preferred embodiment of the present invention.

DESCRIPTION OF THE PREFERRED EMBODIMENT

Referring to FIG. 1, in the preferred embodiment of the invention 10, an open loop 11 of magnetically conductive material having a first end 13 and a second end 14 substantially encircles an electric current conductor 12. The loop 11 is made of a flexible magnetic conductor material such as a ferrous metal. A suitable material for the loop is flexible steel banding of one-half inch or five-eighths inch width. The length of the loop 11 is determined primarily by the physical dimensions of the conductor 12. Its thickness is selected appropriately for the specific application, depending primarily on the magnetic field strength to which it will be exposed. For most residential or small commercial applications a thickness of approximately 1/16 inch is suitable. The loop of magnetic conductor material may be covered with a flexible electrical insulating material, such as overlapping wraps of Scotch 88 (trademark) insulating tape (not shown). This insulation need not be particularly thick if the conductor 12 is adequately covered with insulation and the system voltage is relatively low (i.e., less than 600 volts). The conductor 12 is shown as a single circular conductor. It will be clear that the cross section of the conductor can be other than circular (e.g., a square bus bar) and that the loop 11 could also encircle multiple conductors.

As may be further seen in FIG. 1, in the preferred embodiment the first end 13 of the loop overlaps the second end 14 of the loop and extends tangentially from the loop beyond the area of overlap. The first end 13 is spaced from the second end 14 to form a flux gap 15. The first and second ends 13, 14 are flat in the area of the flux gap 14 and substantially parallel to each other. Except in the area of the flux gap, the tangential extension of the first end 13 is not essential to the magnetic circuit formed by the loop; however, it gives a convenient support to other parts of the invention and cooperates with a loop adjustment means, as described later.

Referring now also to FIG. 2, in accordance with the present invention, a mounting board 16 made of an insulating material is attached by tape, glue or other suitable fastening means to the first end 13 at the flux gap 15. Suitable material for the mounting board is perforated board or circuit board. A (linear) Hall Effect transducer 17, such as the integrated circuit/ceramic base package which is part number 91SS12-2 manufactured by Micro Switch, a division of Honeywell, Inc., is attached to the mounting board. A cable 18 carries three electrical conductors 19 which deliver D.C. supply power to the transducer 17 and communicate the output of the transducer 17. The conductors 19 are preferably threaded through paired openings 20 in the perforated board 16 to provide strain relief. Soldered connections are made between conductors 19 and the transducer 17 at terminals 21.

To permit the invention to be easily adapted to different sizes and shapes of conductors and to be secured in place around such conductors, a strap 22 of adjustable length extends between an indentation 23 on the circumference of the loop 11 and the tangentially extended first end 13 of the loop. Suitable material for the strap 22 is T & B Part No. TY-244 Tyrap (trademark) made by Thomas & Betts Corporation of Elizabeth, N.J. or similar non-metallic adjustable tie. The strap 22 is adjusted to tighten the loop 11 around the conductor 12 while at the same time reducing the flux gap 15 to a minimum dimension determined by the thickness of the mounting board 16, the transducer 17 and any insulation on the loop 11.

When electrical current flows in the conductor 12, an associated magnetic field surrounds the conductor and encompasses the loop 11. The construction and position of the loop 11 and its magnetic permeability relative to air is such that flux from the magnetic field is concentrated in the loop and conducted across the flux gap 15 between the ends 13 and 14. Operating power (8 to 16 volts, 13 ma D.C. for the 91SS12-2) is supplied to the Hall Effect transducer 17 by conductors 19. The flat, parallel surfaces of the ends 13 and 14 direct the flux to impinge vertically on the sensing surface of the transducer 17, for improved sensitivity.

The magnetic flux concentrated in the gap 15 induces a voltage which will alternate around the D.C. supply voltage. This output of the transducer 17 is communicated by conductors 19 to whatever downstream circuitry is attached to cable 18. The output from the transducer 17 is linearly proportional to the strength of the magnetic flux impinging on it. As the magnetic field strength around the conductor 12 is proportional to the electric current in it, the instantaneous output from the transducer 17 is a measure of the instantaneous magnitude of the current.

For simplicity and stability in further signal processing, in the downstream circuitry the output voltage from the transducer 17 may be capacitively coupled to an A.C. amplifier and rectified to a D.C. voltage. This voltage will increase with greater current in the conductor 12 and decrease with reduced current. (For additional details concerning voltage supply requirements and output characteristics of typical transducers, the previously-mentioned Micro Switch publication, "Hall Effect Transducers", may be consulted.)

A major anticipated use for the current sensing device of the invention 10 is as a sensor of current usage level in the service entrance conductor feeding the main circuit breaker or fuses in an electrical panel of an electrical system such as in a factory, business or home. The device is positioned to encircle the service conductor, power is supplied to the transducer and the output from the transducer is communicated downstream to a measurement device or a load management circuit which may be programmed to add or shed loads on a priority basis or cycle loads.

If the device is used on a 110 volt single-phase service, only one will be needed. On a 120/240 volt single-phase service as commonly used for residences, two devices, one for each "hot" conductor would be used. On a 120/208, 120/240 or 277/480 volt three-phase system, three devices would be used.

For measurement or load management applications the downstream circuitry must be calibrated so that the current level (and corresponding power level) in the conductor 12 can be accurately determined from knowledge of the output voltage of the transducer 17. This can normally be done with a variable resistance such as a potentiometer. Once calibration is accomplished, the sensing device can provide continuous monitoring of current and power usage. This information can then be used to control the amount of load allowed on the electrical system at any one time. Thus, at a predetermined high level of current usage the sensing device can trigger a control circuit that sheds loads on the electrical system based on a preselected shedding priority scheme. Similarily, loads can be reconnected in priority order once power demand is permitted to rise.

In summary, the structure of the present invention is such that the flux of the magnetic field associated with the electric current in a conductor is concentrated and conducted to the flux gap 15 between the two ends 13, 14 of the loop 11. This concentration enables the accurate sensing of smaller magnetic fields associated with current levels such as might be encountered in home usage. The invention is easily installed by service personnel or even by a homeowner or business owner. It is easily adaptable to a wide variety of conductor sizes and shapes.

It will be obvious to one skilled in the art that a number of modifications can be made to the above described preferred embodiment without essentially changing the invention. Accordingly, while the preferred embodiment of the invention has been described and illustrated, it is to be understood that the invention is not limited to the precise construction herein disclosed and the right is reserved to all changes and modifications coming within the scope of the invention as defined in the appended claims.

Having thus described the invention, what is claimed as new and desired to be protected by Letters Patent, is:

1. A device for sensing electric current through a conductor comprising:
   a single open, planar loop of flexible, magnetically conductive material positionable to substantially encircle the conductor and having a first end and a second end which overlap in the plane of the loop, the ends being positioned substantially parallel to and spaced from each other in the area of overlap to form a flux gap;
   a Hall Effect transducer positioned in the flux gap between the spaced ends;
   mounting means for holding the transducer in position in the flux gap;
   means for delivering operating power to the transducer; and
   means connected to the transducer for communicating the output of the transducer.

2. The device of claim 1 further comprising loop adjustment means for tightening the loop around the conductor.

3. A device for sensing electric current through a conductor comprising:
   an open loop of flexible, magnetically conductive material positionable to substantially encircle the conductor and having a first end and a second end which overlap, the ends being positioned substantially parallel to and spaced from each other in the area of overlap to form a flux gap, wherein the loop is substantially circular and planar and the first end overlaps the second end on the outside of the circular loop and extends tangentially from the loop beyond the area of overlap;
   a Hall Effect transducer positioned in the flux gap between the spaced ends;
   mounting means for holding the transducer in position in the flux gap;
   means for delivering operating power to the transducer; and
   means connected to the transducer for communicating the output of the transducer.

4. The device of claim 3 wherein the material of the loop is shaped into an indentation at a point on the circumference of the loop substantially opposite the tangential extension of the first end.

5. The device of claim 4 further comprising a fastening means connecting the indentation to the tangentially extended first end.

6. The device of claim 5 wherein the fastening means comprises a strap of adjustable length linking the indentation to the tangentially extended first end.

7. The device of claim 6 wherein the strap is composed of flexible plastic.

8. The device of claim 1 wherein the transducer mounting means comprises:
   a rigid board of insulating material on which the transducer is mounted; and
   means for attaching the rigid board to the first end in the area of overlap.

9. The device of claim 1 wherein the magnetically conductive material is a ferrous metal band.

10. The device of claim 9 wherein the band has a thin rectangular cross section with a thickness of approximately one-sixteenth inch.

11. The device of claim 1 wherein the Hall Effect transducer is a linear Hall Effect transducer.

12. A method of sensing an electric current through a conductor comprising:
  (a) substantially encircling a conductor with a single, open, planar loop of flexible, magnetically conductive material having a first end and a second end;
  (b) positioning the first end substantially parallel to and overlapping and spaced from the second end to form a flux gap;
  (c) mounting a Hall Effect transducer supplied with operating power in the flux gap; and
  (d) providing means for communicating the output of the transducer.

13. A method of sensing an electric current through a conductor comprising:
  (a) substantially encircling a conductor with a loop of flexible, magnetically conductive material having a first end and a second end;
  (b) positioning the first end substantially parallel to and overlapping and spaced from the second end to form a flux gap;
  (c) mounting a Hall Effect transducer supplied with operating power in the flux gap;
  (d) providing means for communicating the output of the transducer; and
  (e) adjusting the size of the loop to snugly encircle the conductor.

14. The method of claim 13 which further comprises adjusting the width of the flux gap between the first and second ends to a minimum.

* * * * *